(12) United States Patent
Chen (10) Patent No.: US 8,004,070 B1
(45) Date of Patent: Aug. 23, 2011

(54) WIRE-FREE CHIP MODULE AND METHOD (76) Inventor: Wei Chen, Saratoga, CA (US)

( * ) Notice: Subject to any disclaimer, the term of this patent is extended or adjusted under 35 U.S.C. 154(b) by 147 days.

(21) Appl. No.: 12/111,868

(22) Filed: Apr. 29, 2008

(51) Int. Cl.
*H01L 23/495* (2006.01)
(52) U.S. Cl. . 257/676; 257/690; 257/778; 257/E23.044; 257/E23.141; 257/E21.506; 438/123
(58) Field of Classification Search .................. None
See application file for complete search history.

(56) References Cited

U.S. PATENT DOCUMENTS

| | | | |
|---|---|---|---|
| 5,214,308 A * | 5/1993 | Nishiguchi et al. ........... 257/692 |
| 6,008,999 A * | 12/1999 | Marrero ..................... 363/21.01 |
| 6,232,148 B1 * | 5/2001 | Ma et al. ..................... 438/112 |
| 6,238,950 B1 * | 5/2001 | Howser et al. ............... 438/106 |
| 6,388,336 B1 * | 5/2002 | Venkateshwaran et al. .. 257/779 |
| 7,176,506 B2 * | 2/2007 | Beroz et al. ................... 257/232 |
| 2005/0280163 A1 * | 12/2005 | Schaffer et al. ............... 257/778 |

* cited by examiner

*Primary Examiner* — Marcos D Pizarro
*Assistant Examiner* — Andrés Muñoz
(74) *Attorney, Agent, or Firm* — Michael C. Stephens, Jr.

(57) ABSTRACT

A wire-free chip module and method. The wire-free chip module including a conductive pattern formed from at least a portion of a lead frame, the conductive pattern including a plurality of pads; at least two electrical components that includes an integrated circuit and a passive component, the integrated circuit and the passive component bonded to the plurality of pads by solder; and wherein the conductive pattern is disposed to interconnect at least a portion of the integrated circuit with the passive component.

27 Claims, 7 Drawing Sheets

WIRE-FREE CHIP MODULE AND METHOD

BACKGROUND OF THE INVENTION

1. Field of the Invention

The present invention generally relates to chip packaging techniques and modules. More particularly, the present invention relates to wire-free chip modules and methods that are suitable for use in a wide variety of applications, including a power module having relatively high current density and efficiency, as well as relatively low parasitic inductance.

2. Background Art

Figure 1:
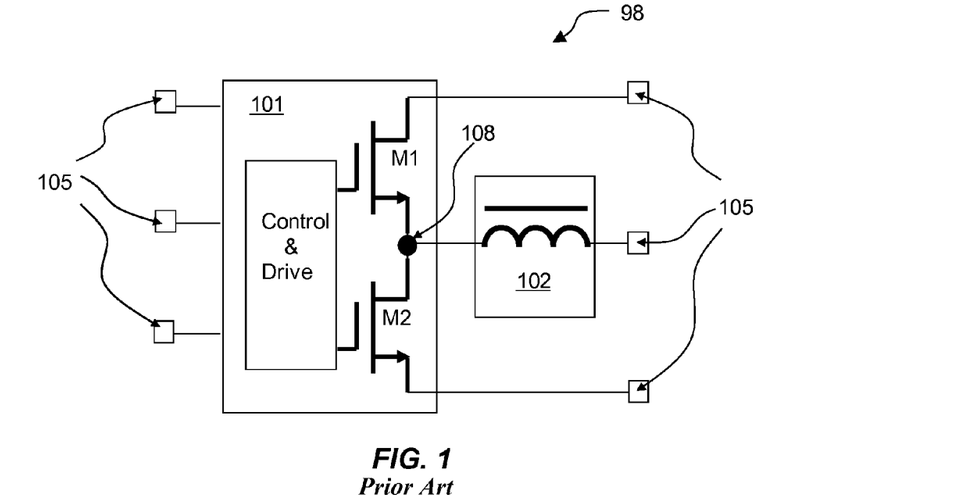
FIG. 1 is a block-level schematic diagram of a semiconductor power circuit that comprises an IC and an inductor.
Figure 2A:
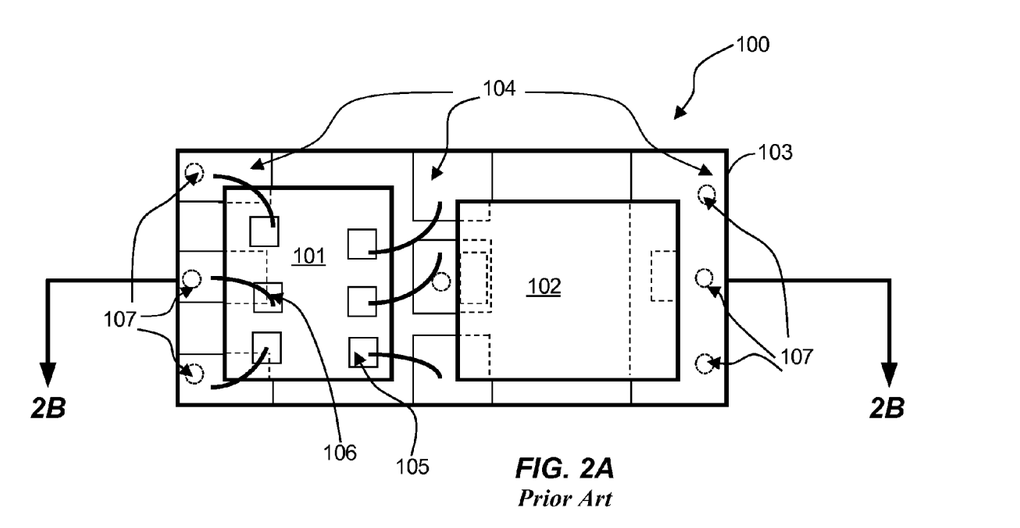
FIGS. 2A and 2B are respective top and side view illustrations of the semiconductor power circuit shown in FIG. 1 that has been assembled using traditional SOC module assembly techniques.
Figure 2B:
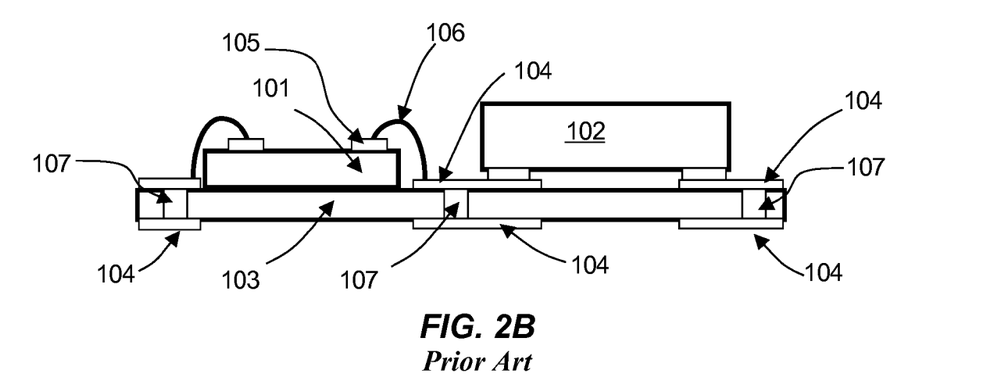

System on chip (SOC) packaging techniques are well-known and has been used in power supply applications. In recent years, several semiconductor manufacturers have released power modules in SOC packaging form. For example, as shown in FIG. 1 and FIGS. 2A-2B, a semiconductor power circuit 98 may comprise an integrated circuit (IC) 101 and at least one passive component, such as inductor 102. Traditional SOC techniques that include assembling semiconductor power circuit 98 into a SOC power module 100 by using surface mounted topologies for its components and by mounting these components, such as an IC 101 and inductor 102, to a printed circuit board (PCB) or equivalent substrate 103 having conductive traces 104 and vias 107. IC 101 is in the form of a power IC and includes a pair of switching devices, M1 and M2, that are coupled together in series at a connection point, named "switch connection point", 108 as shown. This SOC technique also includes using wire bonds 106 to interconnect these components through their respective solder pads 105 to conductive traces 104. While this technique is mature and more readily available in the industry, it suffers from at least one of the following disadvantages: relatively high manufacturing cost, higher power loss in the interconnections, relatively large parasitic inductance, current capability limited by the use of the wire bonds and PCB technique, and a package size that has a relatively large footprint and low thermal dissipation. These drawbacks limit the suitability of using SOC packaging to semiconductor power circuits that use relatively low current, low switching frequency or both. Consequently, a need exists for a solution that minimizes or eliminates most, if not all of the above problems.

SUMMARY

A wire-free chip module and method is disclosed. The wire-free chip module includes a conductive pattern formed from at least a portion of a lead frame, the conductive pattern including a plurality of pads; at least two electrical components that includes an integrated circuit and a passive component, the integrated circuit and the passive component bonded to the plurality of pads by solder; and wherein the conductive pattern is disposed to interconnect at least a portion of the integrated circuit with the passive component.

In another embodiment, the method for assembling a wire-free chip module is also disclosed. The method includes: forming a conductive pattern from at least a portion of a lead frame, the conductive pattern including a plurality of pads, the plurality of pads including a first pad having at least a first edge and a second pad having at least a second edge; coupling at least two electrical components to the conductive pattern, the electrical components including an integrated circuit and a passive component, the coupling includes bonding the integrated circuit and the passive component to the plurality of pads; and wherein the conductive pattern is disposed for interconnecting at least a portion of the integrated circuit with the passive component.

DETAILED DESCRIPTION OF THE INVENTION

While the invention has been described in conjunction with a specific best mode, it is to be understood that many alternatives, modifications and variations, including those that are outside of the specific dimensions or ranges of dimensions described herein, will be apparent to those skilled in the art in light of the following description. The use of these alternatives, modifications and variations in or with the various embodiments of the invention shown below would not require undue experimentation or further invention.

The various embodiments of the present invention pertain to a wire-free chip module that can provide relatively low manufacturing cost, low power dissipation interconnections, and high current capability and that can provide a package size which has a relatively small footprint and low thermal dissipation, rendering these embodiments highly suitable for packaging various semiconductor power circuits, including circuits of relatively high current density, high frequency or both. These embodiments include using a lead frame or a portion of the lead frame as part of the wire-free chip module. Using a lead frame can minimize the interconnection impedance and parasitic inductance commonly found in traditional SOC packages. In addition, these embodiments can be used to implement a variety of circuits, including a semiconductor power circuit that allows high switching frequency and high current density. In each of the embodiments disclosed, one surface of an IC forming a portion of the semiconductor power circuit may be electrically connected to the lead frame using a flip chip technique, enabling the other side of the IC available for coupling to another substrate, such as a main system circuit board, heat sink or both. This technique is particularly useful in monolithic power ICs that have built-in power devices.

The term semiconductor power circuit is intended to be interpreted broadly, and may include any mixed circuit that regulates, switches, inverts, rectifies, or any combination of these, current or voltage. For example, a semiconductor power circuit may include an AC to DC or DC to DC power regulator that employs at least one active circuit in the form of an integrated circuit, which may also be referred to as an IC or silicon chip, that is coupled to at least one passive element, such as an inductor, capacitor and the like.

Figure 3A:
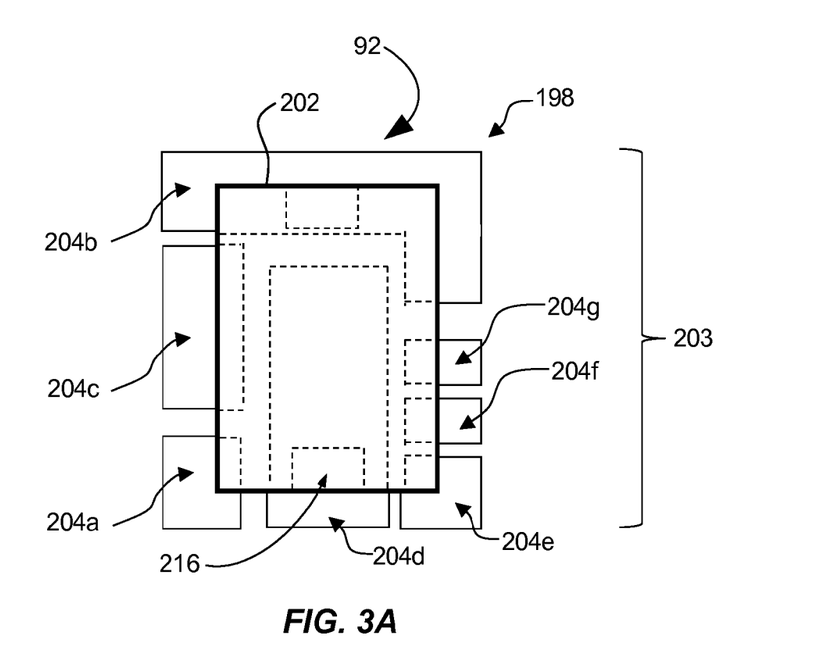
FIGS. 3A through 3B are respective top and bottom view illustrations of the semiconductor power circuit shown in FIG. 1 that is implemented in the form of a wire-free chip module in accordance with one embodiment of the present invention.
Figure 3B:
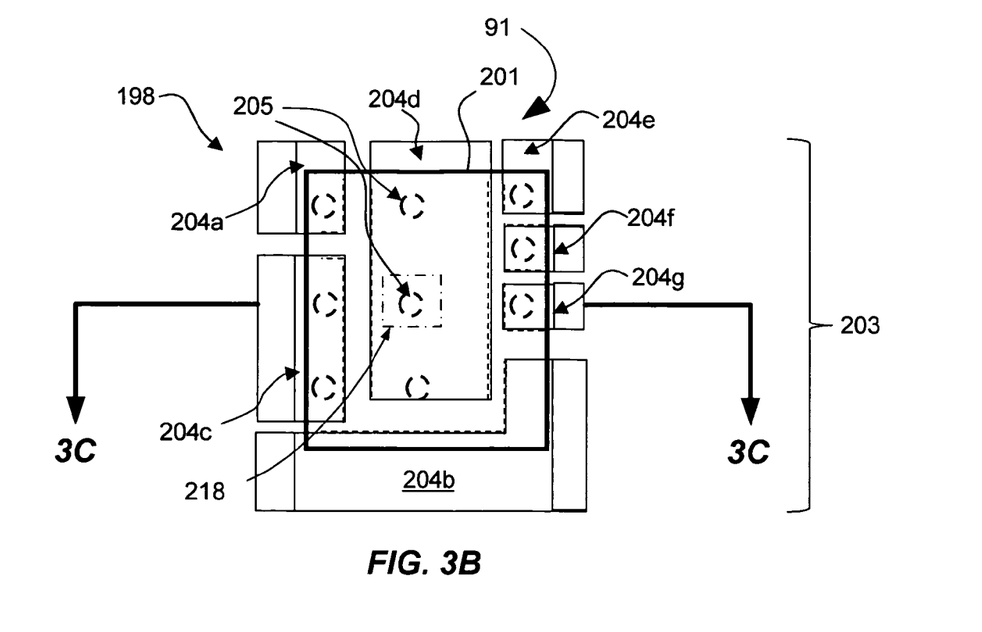
Figure 3C:
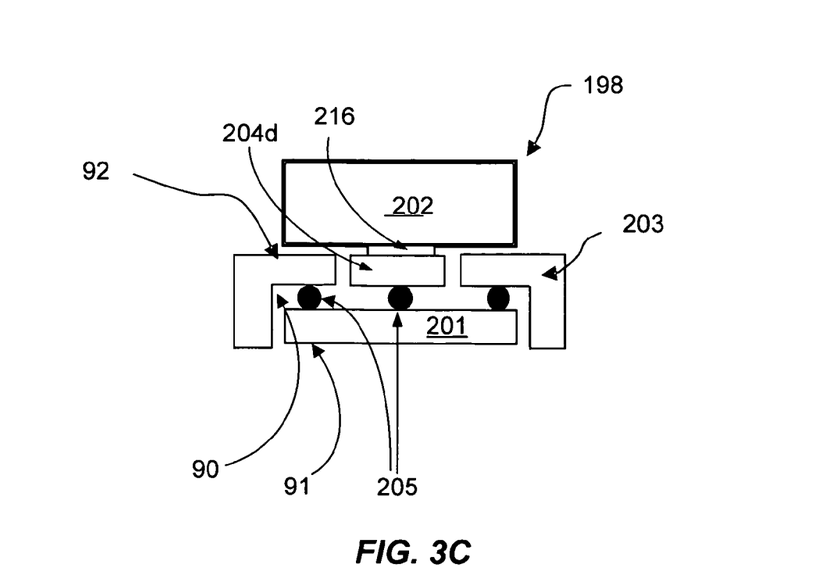
FIG. 3C is a side view illustration from section line 3C-3C of the wire-free chip module illustrated in FIG. 3B.

FIGS. 3A through 3C are respective top, bottom and side view illustrations of a wire-free chip module 198 implementation of semiconductor power circuit 98 in FIG. 1 in accordance with one embodiment of the present invention. Wire-free chip module includes a conductive pattern 203 having a set of conductive pads, such as pads 204a through 204g, that are suitable for electrically coupling integrated circuit 201 with inductor 202 in a manner desired, such as the circuit arrangement used for semiconductor power circuit 98 in FIG. 1. For example, pad 204d may be used to conduct signals between or among selected solder pads from selected components, such as between a solder pad 216 of inductor 202 and a switch connection point 218 from integrated circuit 201. Integrated circuit 201 and inductor 202, switch connection point 218 may be implemented to have substantially the same function and structure as integrated circuit 101, inductor 102 and switch connection point 108, respectively, in FIG. 1. Switch connection point 218 is shown bonded to pad 204d by solder ball 205.

Conductive pattern 203 may be any metal or alloy that can conduct electricity and may also have relatively low thermal resistance. In the embodiment shown, conductive pattern 203 is implemented in the form of a metal comprised of copper although the use of copper as a conductive pattern material is not intended to be limiting in any way. Other types of metals or metal alloys may be used as long as the metal employed provides conduction between components used in the circuit design being rendered into a module assembly as disclosed herein. During manufacture, conductive pattern 203 may be cut, stamped, or etched from a lead frame or a portion of a lead frame (not shown) so that that the resulting pattern provides a circuit pattern suitable for interconnecting integrated circuit 201 and inductor 202 when these components are mounted to conductive pattern 203. Power dissipating component(s), such as integrated circuit 201, is mounted on a first surface 90 of conductive pattern 203, while less power dissipating component(s), typically, passive component(s), such as inductor 202, may be mounted on a second surface 92 of conductive pattern 203. Placing a power dissipating component on a surface that is separate from the surface used to mount a passive component exposes a surface, such as surface 91, of the power dissipating component, such as integrated circuit 201, so that this exposed surface 91 is available for thermal coupling to a main circuit board, heat sink or both. Thermal coupling may be provided by directly coupling exposed surface 91 to a main circuit board. Such a main circuit board may be that of a computing device, such as a computer, PDA, cell phone, or equivalent portable computing device. In the embodiment shown, first surface 90 and second surface 92 generally face in opposite directions but such orientation is not intended to limit the present invention in any way.

Inductor 202 may be surface mounted and bonded to its respective pads of conductive pattern 203 by using solder, such as reflow solder or by using solder balls 205. Integrated circuit 201 may be flip chipped and mounted to conductive pattern 203 using solder balls 205. This embodiment disclosed eliminates the need to use substrate materials, wire bonds, vias or any combination of these materials to connect circuit components, which reduces power loss and manufacturing cost. Without wire bonds, the parasitic inductance in series with the power devices, such as integrated circuit 201, are further minimized, permits an increase in switching speed, and results in a smaller module size. Molding compound (not shown) may be used to encapsulate wire-free chip module 198, producing a packaged chip module (not shown).

To improve the robustness of the overall assembly, non-conductive buffer materials (not shown) can be filled between integrated circuit 201 and conductive pattern 203, between inductor 202 and conductive pattern 203, or both. Additionally, to further increase the robustness or resistance of solder balls 205 from mechanical failure, these non-conductive buffer materials can be filled among solder balls 205 and integrated circuit 201, and among solder balls 205 and the pads of a surface mount component, such as the pads from inductor 202.

Figure 3D:
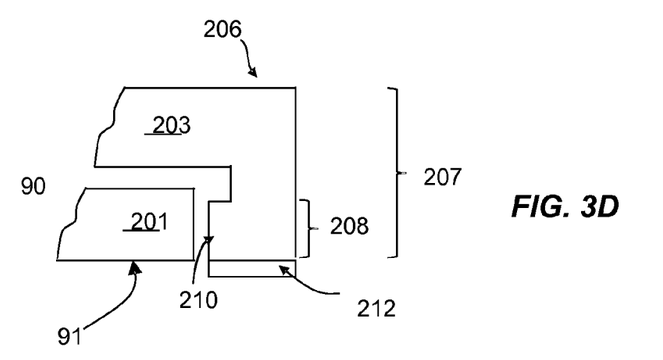
FIG. 3D illustrates a portion of a conductive pattern formed from a lead frame and disposed to include at least one pin lead with a tip portion configured to point generally inwards, such as towards the center of the conductive pattern or towards a mounted integrated circuit, in accordance with another embodiment of the present invention.

As an additional embodiment, the periphery of conductive pattern 203 may be bent to form pin leads for wire-free chip module 198. For example, referring to FIG. 3D, a periphery 206 of conductive pattern 203 is bent at approximately 90 degrees from first surface 90. A tip portion 208 of periphery 206 is also bent and in the example shown, is bent inward so that an end 210 of tip portion 208 points generally towards integrated circuit 201 or towards a center location of conductive pattern 203. When configured in this manner, conductive pattern 203 may also be used to provide the pin lead(s) for wire-free chip module 198, such as pin lead 207. The configuration shown in FIG. 3D is simply an example and is not intended to limit the present invention in any way.

Figure 3E:
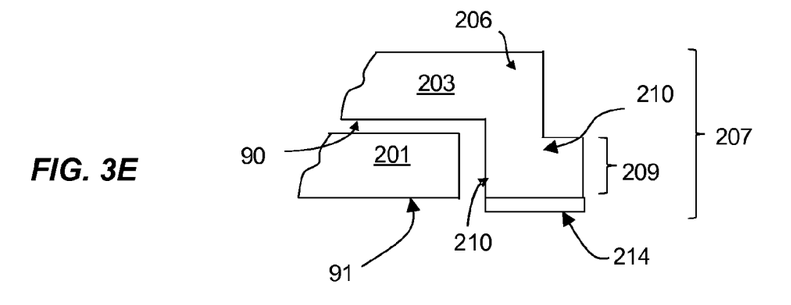
FIG. 3E illustrates a portion of a conductive pattern that is formed from a lead frame that is disposed to include at least one pin lead with a tip portion configured to point generally outwards, such as away from the center of the conductive pattern or away from a mounted integrated circuit, in accordance with yet another embodiment of the present invention.

For example, also referring to FIG. 3E, tip portion 209 may be bent outward so that end 210 points generally away from integrated circuit 201 or from a center location of conductive pattern 203, providing another configuration example for a pin lead, such as pin lead 207. To facilitate board level soldering assembly, the length of pin lead 207 may be disposed to extend outside the module body formed when wire-free chip power module is packaged or encapsulated with a molding compound. Bending tip portion 208 or 209 either inward or outward as disclosed also provides a surface to which solder may be applied, such as solder 212 or 214, respectively.

The various embodiments of the present invention herein disclosed are suitable for implementing a wide range of circuits, including circuits with high current requirements. These embodiments eliminate the need for wire bonds, vias and PCB traces to interconnect circuit components, and are inherently lower cost. Thick copper lead frames may be cost-effectively fabricated into the conductive pattern desired by using various known mass production methods. The present invention also eliminates the need to provide an electrical connection through or on the surface of an integrated circuit facing away from the conductive pattern, such as surface 91 in FIGS. 3C through 3E. In the embodiment shown in FIGS. 3A and 3E, integrated circuit 201 may be disposed to only have one surface that provides conductive pads, named "active surface". These pads are bumped with solder balls to facilitate flip chip mounting during assembly.

Although the above embodiments disclose using a single integrated circuit with a single passive component, one of ordinary skill in the art after receiving the benefit of the herein disclosure would readily recognize that these embodiments may be readily extended to a wire-free chip module that includes multiple integrated circuits, multiple passive components, or both. For example, FIGS. 5A through 5C illustrate a wire-free chip module 298 that includes multiple integrated circuits and multiple passive components which are electrically coupled by using a conductive pattern 303 formed from at least a portion of a lead frame (not shown), and that conforms with a circuit design desired, such as a DC-DC power circuit 300 disclosed in FIG. 4.

Figure 4:
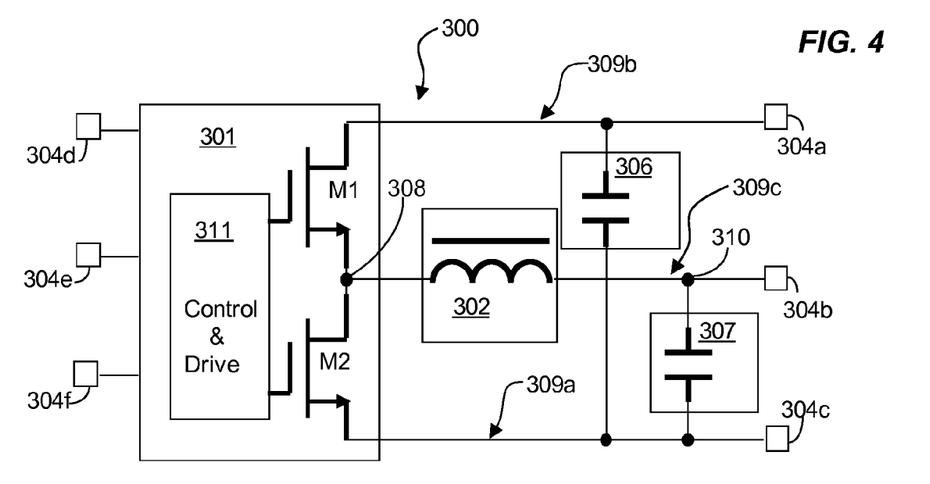
FIG. 4 is a circuit schematic of a semiconductor power circuit.

Circuit 300 in FIG. 4 includes a power IC 301, an inductor 302, capacitors 306 and 307, and six solder pads 304a, 304b, 304c, 304d, 304e, and 304f. Solder pads 304d, 304e and 304f are the feedback and control pins for circuit 300. In step down applications, capacitor 306 is used as the input capacitor, while capacitor 307 is used as the output capacitor. Power IC 301 includes a control and drive circuit 311 that controls a pair of switching components M1 and M2, and is coupled to the gates of switching components M1 and M2. The drain of switching components M2 is coupled to the source of M1, creating a switch connection point 308, while the source of switching component M2 and drain of switching component M1 are respectively coupled to DC rails 309a and 309b. Switch connection point 308 is coupled to one terminal of inductor 302. The other terminal of inductor 302 is coupled to rail 309c, which in turn is coupled to pad 304b and one terminal of an output capacitor, such as capacitor 307, forming an interconnection point 310. Rail 309c functions as the output rail for power circuit 300. In addition, the terminals of capacitor 306 are respectively coupled to DC rails 309a and 309b, while the terminals of output capacitor 307 are respectively coupled to an output rail, such as rail 309c, and to a ground rail, such as DC rail 309a. Switching components M1 and M2 may be implemented using a pair of FETs although using FETs as switching devices is not intended to be limiting. Any device that can provide a switching function and that can be controlled by control and drive circuit 311 may be used.

Figure 5A:
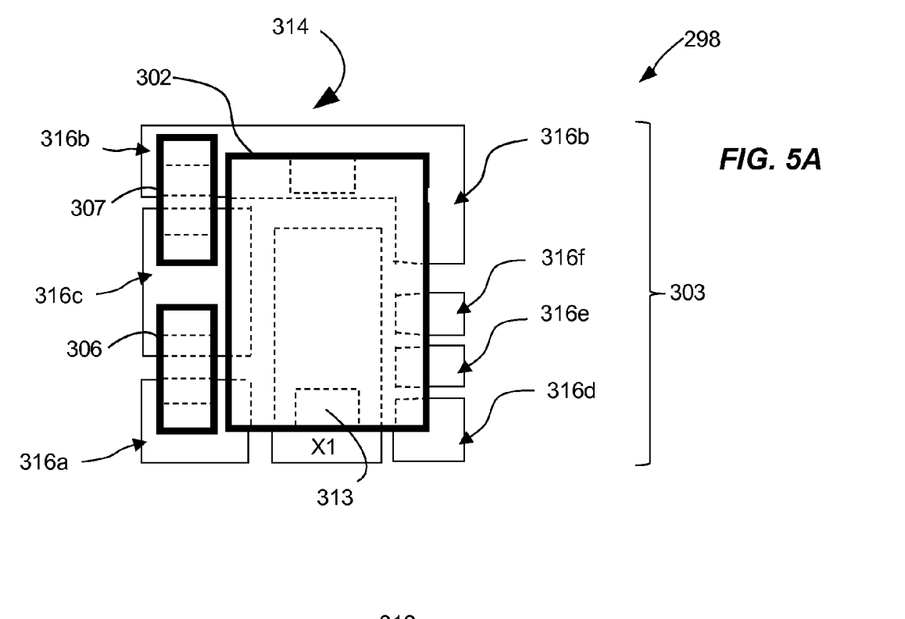
FIGS. 5A through 5B are respective top and bottom view illustrations of the semiconductor power circuit shown in FIG. 4 that is implemented in the form of a wire-free chip module in accordance with yet a further embodiment of the present invention.
Figure 5B:
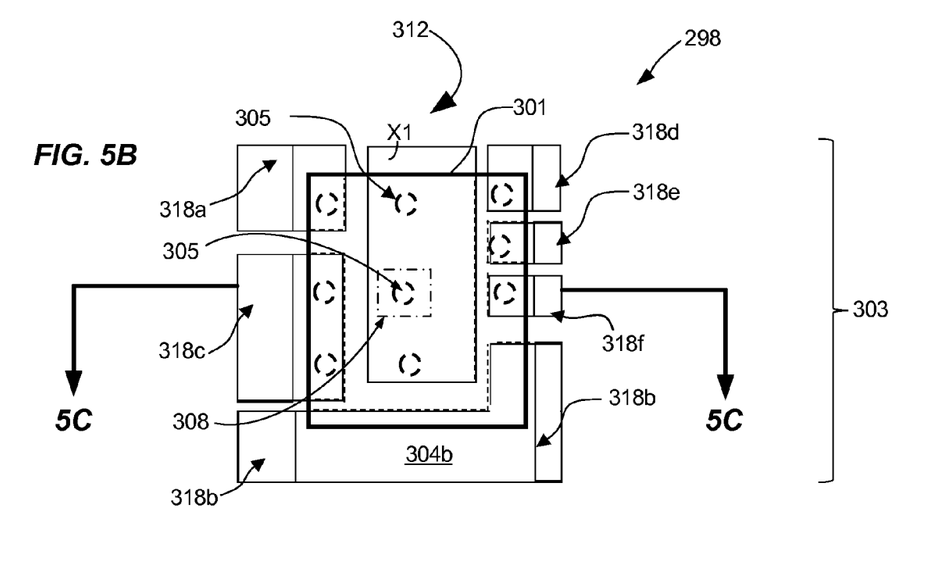
Figure 5C:
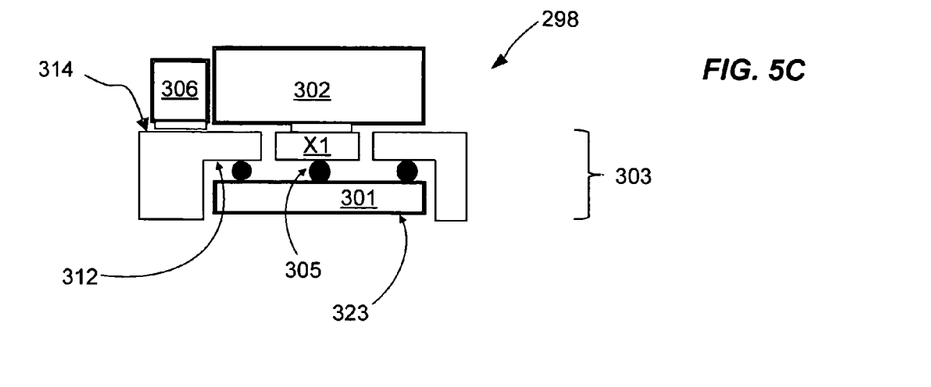
FIG. 5C is a side view illustration from section line 5C-5C of the wire-free chip module illustrated in FIG. 5B.

Referring now to FIGS. 5A through 5C, conductive pattern 303 includes a first surface 312, a second surface 314, a set of conductive pads 316a through 316f, pad X1, and a set of pin leads 318a through 318f. Pads 316a through 316f and pad X1 provide an electrical connection between and among circuit components included with wire-free chip module 298, which in the example shown, include passive components, such as capacitors 306 and 307, and inductor 302, as well as an integrated circuit, such as power IC 301. Conductive pattern 303, pads 316a through 316f and pad X1 provide the interconnections necessary to interconnect these circuit components in the manner shown by the schematic of circuit 300 shown in FIG. 4. For example, pad X1 may be used to conduct signals between or among selected solder pads from selected components, such as between a solder pad 313 of inductor 302 and switch connection point 308 from integrated circuit 301. Pad 316c may be used to implement DC rail 309a, while pad 316b may be used to implement rail 309c, and pad 316a may be used to implement DC rail 309b in FIG. 4. Switch connection point 308 is shown bonded to pad X1 by solder from solder ball 305. Pin leads 318a through 318f may be formed in the manner discussed with reference to FIGS. 3D and 3E and may be used respectively as conduits for transmitting signals between each respective pin and an external circuit that is not part of wire-free chip module 298. For example, pin leads 318a, 318b and 318c may be used to implement solder pads 304a, 304b, 304c in FIG. 4.

Conductive pattern 303 may be any metal or alloy that can conduct electricity and may also have relatively low thermal resistance, and may be fabricated from a lead frame (not shown) or a portion of the lead frame as described above with respect to FIGS. 3A through 3F, above. Wire-free chip module 298 also includes a means for bonding the pads, such as conductive pads 316a through 316f, and pad X1, of conductive pattern 303 with these circuit components. This means for bonding may include solder, such as solder paste, solder balls or both. Power IC 301 is disposed to have a surface populated by a set of pads which may be bonded to the first surface 312 of the pads of integrated conductive pattern 303 by using solder balls 305 and flip-chip technology. The other surface 323 of power IC 301 that does not face integrated conductive pattern 303 may be used for thermally bonding power IC 301 to a heat sink or a system board.

Passive components, such as capacitors 306 and 307, and inductor 302, may be mounted on the second surface 314 of the pads of integrated conductive pattern 303. For example, the pads of capacitor 306 may be respectively bonded to the second surface of pads 316a and 316c, respectively, while the pads of capacitor 307 may be respectively bonded to the second surface of pads 316c and 316b. The pads of inductor 302 may be respectively bonded to the second surface of pads X1 and 316b. As an optional implementation, to improve reliability and thermal conductivity, non-conductive buffer materials can be added to relieve or reduce any stress between power IC 301 and the solder balls used to bond power IC 301 to selected pads of conductive pattern 303 on first surface 312, and between pads of conductive pattern 303 and the passive components that connect to them on second surface 314.

In addition, wire-free chip module 298 may be assembled so that a capacitor that provides a decoupling function, such as input capacitor 306, may be placed directly above selected pads, such as pads 316a and 316c, from conductive pattern 303 that provide substantially the same function as DC rails 309b and 309a in FIG. 4. This arrangement minimizes the parasitic inductance in series with switching devices M1 and M2, enabling a relatively high switching frequency during operation and reducing the sizes of the inductor and capacitors used, and thus the overall size of Wire-free chip module 298.

Figure 6A:
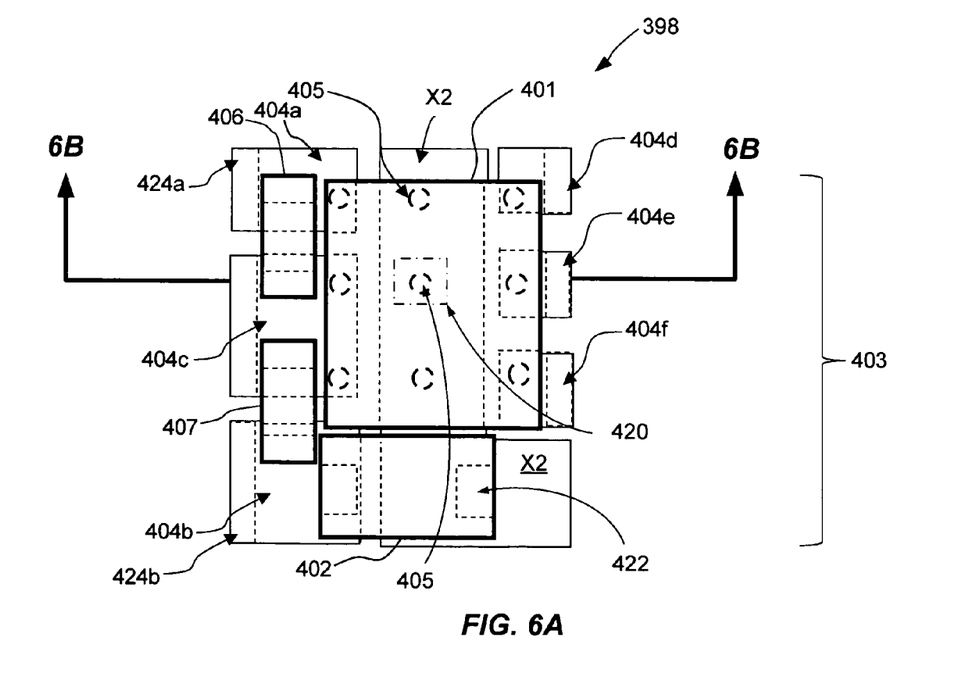
FIG. 6A is a top view illustration of the semiconductor power circuit shown in FIG. 4 that is implemented in the form of a wire free chip module in accordance with yet another embodiment of the present invention.
Figure 6B:
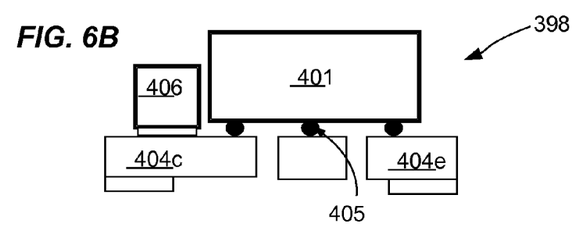
FIG. 6B is a side view illustration at section 6B-6B of the wire-free chip module illustrated in FIG. 6A.

In applications that require a component height lower than that provided by the embodiments disclosed above, it may be desirable to place an integrated circuit on the same side as the surface mounted passive components. FIGS. 6A and 6B show an example of such an implementation. An integrated circuit, such as power IC 401, is flip-chip mounted onto a conductive pattern 403 of a lead frame or a portion of a lead frame (not shown). Capacitor 406, capacitor 407 and output inductor 402 are placed besides power IC 401 and on the same side of conductive pattern 403. This implementation, while increasing the footprint slightly, still achieves a relatively minimum parasitic inductance inside the decoupling loop formed by switching components M1 and M2 (not shown in FIGS. 6A and 6B) and input capacitor 407. Switching components M1 and M2 are provided by power IC 401. In this example, power IC 401, capacitor 406, capacitor 407, and output inductor 402 have substantially the same form and function as power IC 301, capacitor 306, capacitor 307, and inductor 302, respectively, in FIG. 4. In addition, power IC 401 includes a switch connection point 420 substantially similar in function to switch connection point 308.

Conductive pattern 403 includes pads 404a through 404f and pad X2 that provide the interconnections necessary to connect circuit components according to a selected circuit, such as the schematic of circuit 300 shown in FIG. 4. For example, pad X2 may be used to conduct signals between or among selected solder pads from selected components, such as between a solder pad 422 of inductor 402 and switch connection point 420 from integrated circuit 401. Pad 404c may be used to implement DC rail 309a, while pad 404b may be used to implement rail 309c, and pad 404a may be used to implement DC rail 309b in FIG. 4. Switch connection point 420 is shown bonded to pad X2 by solder from solder ball 405. Conductive pattern 403 may also be configured to include pin leads, which may formed in the manner discussed above.

Using wire-free chip module 298 or 398 to implement circuit 300 in FIG. 4, allows a decoupling loop formed by a decoupling capacitor, such as capacitor 306, DC rails 309a and 309b, and switching components M1 and M2 to be minimized. As shown in FIGS. 5A and 5B or FIGS. 6A and 6B, switching components M1 and M2 are connected between two pads implementing DC rails 309b and 309a, such as pads 316a and 316c in FIGS. 5A and 5B, or pads 404a and 404c in FIGS. 6A and 6B. One approach for minimizing the decoupling loop includes orienting the edges of the two pads that are used to implement DC rails 309a and 309b, so that the edges of the pads facing each other are approximately parallel with each other. In addition, these edges may also be placed at a selected distance suitable for minimizing parasitic inductance of the decoupling loop. This suitable distance may be twice the thickness of the two pads. Using twice the thickness of the two pads is not intended to be limiting in any way but depends on the minimum distance achievable in light of current manufacturing tolerances available.

In accordance with yet another embodiment of the present invention, it is desirable to lay out switching components M1 and M2 side by side with DC terminals, such as the drain terminal of M1 and the source terminal of M2 if both M1 and M2 are N type MOSFETs, that are located adjacent to the two pads used to implement DC rails 309b and 309a, such as pads 404a and 404b in FIG. 6A. This configuration enables a capacitor used as the decoupling capacitor, such as capacitor 406, to be placed adjacent or near the DC terminals of switching components, such as the drain terminal of M1 and the source terminal of M2 if both M1 and M2 are N type MOSFETs, and to further minimize the parasitic inductance inside the decoupling loop formed by switching devices M1 and M2, the input capacitor and the elements used to implement DC rails 309a and 309b.

Figure 7:
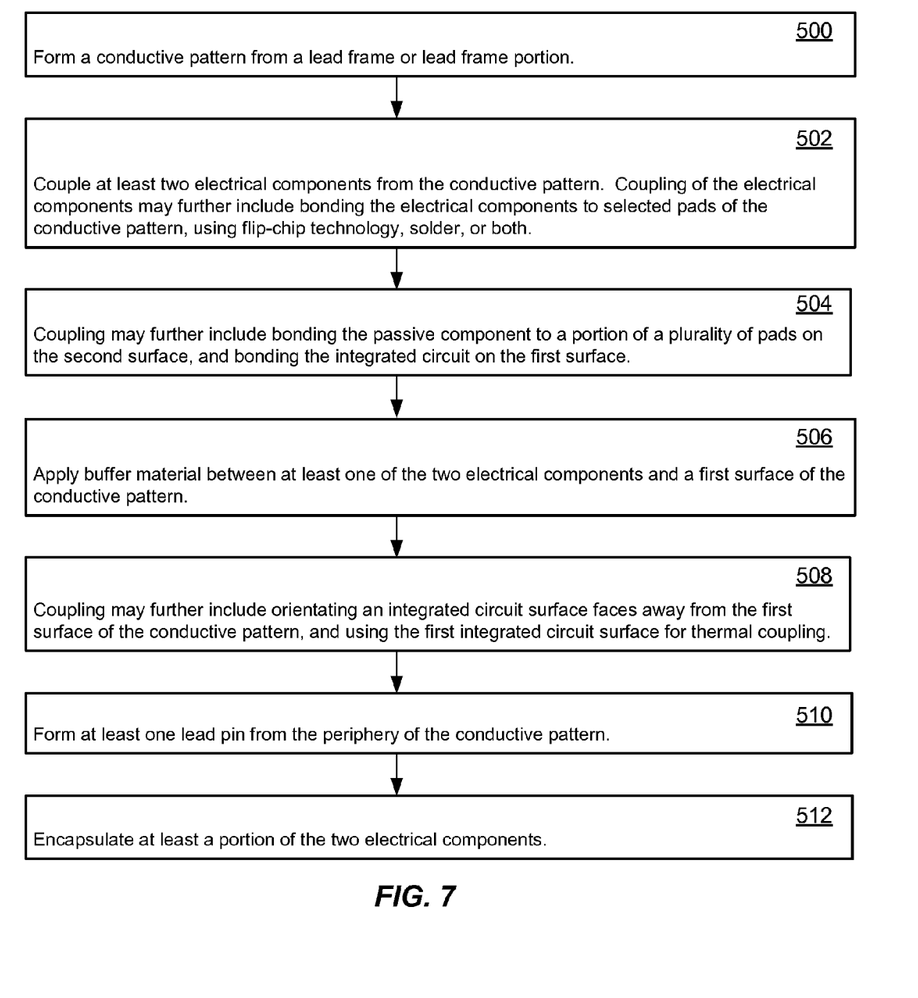
FIG. 7 illustrates in block form a method of fabricating a wire-free chip module in accordance with various embodiments of the present invention.

FIG. 7 illustrates in block form a method of fabricating a wire-free chip module in accordance with various embodiments of the present invention.

At step 500, a conductive pattern from a lead frame or lead frame portion is formed. This conductive pattern includes a plurality of pads and is disposed to form a pattern that would interconnect at selected electrical components according to a circuit desired.

At step 502, at least two electrical components are coupled to the conductive pattern. For example, these electrical components may include an integrated circuit and a passive component, such as power IC 301 and inductor 302 above. Coupling of the electrical components may further include bonding the electrical components to selected pads of the conductive pattern, using flip-chip technology, solder, or both.

As an alternative embodiment, at step 508, coupling may further include bonding the passive component to a portion of the plurality of pads on the second surface, and bonding the integrated circuit on the first surface.

In another alternative embodiment, at step 506, a buffer material may be applied between at least one of the two electrical components and a first surface of the conductive pattern.

In another alternative embodiment, at step 508, coupling may further include orientating an integrated circuit surface faces away from the first surface of the conductive pattern, and using the first integrated circuit surface for thermal coupling.

In another alternative embodiment, at step 510, at least one lead pin is formed from the periphery of the conductive pattern.

In another alternative embodiment, at step 512, a molding compound is used to encapsulate at least a portion of the two electrical components.

While the present invention has been described in particular embodiments, it should be appreciated that the present invention should not be construed as limited by such embodiments. Rather, the present invention should be construed according to the claims below.

What is claimed is:

1. A chip module, comprising:
   a conductive pattern formed from at least a portion of a lead frame, said conductive pattern having a plurality of pads for electrical coupling thereto;
   a power integrated circuit, first and second capacitors, and a passive component, wherein said power integrated circuit comprises a first switching transistor coupled to a first DC rail and a switch connection point, and a second switching transistor coupled to a second DC rail and said switch connection point, said power integrated circuit and said passive component being separate components that are bonded to said plurality of pads by solder;
   wherein said conductive pattern is disposed to electrically interconnect said switch connection point of said power integrated circuit with said passive component without using bonding wires, wherein said first capacitor is coupled to said first and second DC rails, and wherein said second capacitor is coupled to said passive component and said second DC rail; and
   wherein said power integrated circuit is bonded to a first surface of said conductive pattern by solder, and wherein said passive component and said first and second capacitors are bonded to a second surface of said conductive pattern by solder, said first and second surfaces of said conductive pattern being on opposite sides of said conductive pattern, said power integrated circuit having a bottom integrated circuit surface facing opposite said first surface, said bottom integrated circuit surface being exposed for coupling to at least one of a heat sink and a main system circuit board.

2. The chip module of claim 1, wherein said portion of said lead frame comprises a periphery disposed to provide at least one lead pin for external connection to said chip module.

3. The chip module of claim 1, wherein said power integrated circuit is flipped and bonded to said plurality of pads by using flip chip technology and said solder such that said bottom surface of said power integrated circuit is exposed on said chip module.

4. The chip module of claim 1, further comprising:
a buffer material disposed between said power integrated circuit and said first surface of said conductive pattern.

5. The chip module of claim 1, further comprising:
a buffer material disposed between said passive component and said second surface of said conductive pattern.

6. The chip module of claim 1, wherein said bottom integrated circuit surface is exposed for coupling to said heat sink for providing thermal coupling.

7. The chip module of claim 1, wherein a computing device comprises said main system circuit board.

8. The chip module of claim 1, wherein said power integrated circuit comprises:
a top integrated circuit surface having a plurality of pads for conducting signals; and
said bottom integrated circuit surface that is exposed only for thermal coupling.

9. The chip module of claim 1, further comprising a molding compound for encapsulating at least a portion of said power integrated circuit and said passive component.

10. The chip module of claim 1, wherein said plurality of pads comprises a first pad having at least a first edge and a second pad having at least a second edge.

11. The chip module of claim 10, wherein said first or said second capacitor is coupled to said first and second pads.

12. The chip module of claim 11, wherein said first or said second capacitor is disposed across said first and second edges.

13. A method of assembling the chip module of claim 1, the method comprising:
forming said conductive pattern from said lead frame, said plurality of pads including a first pad having at least a first edge and a second pad having at least a second edge;
coupling said power integrated circuit, said first and second capacitors, and said passive component to said conductive pattern, wherein said coupling includes bonding said power integrated circuit and said passive component to said plurality of pads; and
wherein said conductive pattern is disposed for interconnecting at least a portion of said power integrated circuit with said passive component.

14. The method of claim 13, further comprising:
forming at least one lead pin from said a periphery of said lead frame for external connection to said chip module.

15. The method of claim 13, wherein said bonding comprises flipping and bonding said power integrated circuit to said plurality of pads by using flip-chip technology and solder such that said bottom surface of said power integrated circuit is exposed on said chip module.

16. The method of claim 13, further comprising:
applying a buffer material between said power integrated circuit and said first surface of said conductive pattern.

17. The method claim 13, wherein said coupling further comprises:
bonding said passive component to a portion of said plurality of pads on said second surface; and
bonding said power integrated circuit on said first surface of said conductive pattern.

18. The method of claim 13, wherein said coupling further comprises connecting said heat sink to said bottom integrated circuit surface to provide thermal coupling.

19. The method of claim 13, further comprising:
encapsulating at least a portion of said power integrated circuit and said passive component by using a molding compound.

20. The method of claim 13, wherein said coupling further comprises connecting said main system circuit board to said bottom integrated circuit surface.

21. The chip module of claim 1, wherein interconnections between said power integrated circuit and said passive component are free of vias.

22. The chip module of claim 1, wherein interconnections between said power integrated circuit and said passive component are free of printed-circuit board (PCB) traces.

23. The chip module of claim 1, wherein said passive component comprises an inductor.

24. The chip module of claim 1, wherein said first surface of said conductive pattern is on a different plane from said second surface of said conductive pattern.

25. The chip module of claim 1, wherein a pad of said conductive pattern at said switch connection point is not bent from said first surface.

26. The chip module of claim 1, wherein a portion of said conducting pattern is bent at approximately 90 degrees from said first surface to form a pin lead.

27. The chip module of claim 1, wherein said solder is disposed on a flat surface of each of said plurality of pads.

* * * * *